(12) United States Patent
Fu

(10) Patent No.: US 12,197,124 B2
(45) Date of Patent: Jan. 14, 2025

(54) LITHOGRAPHY MEASUREMENT MACHINE AND OPERATING METHOD THEREOF

(71) Applicant: HON HAI PRECISION INDUSTRY CO., LTD., New Taipei (TW)

(72) Inventor: Kuo-Kuei Fu, Hsinchu (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 602 days.

(21) Appl. No.: 17/643,403

(22) Filed: Dec. 8, 2021

(65) Prior Publication Data

US 2023/0114246 A1    Apr. 13, 2023

(30) Foreign Application Priority Data

Oct. 12, 2021 (TW) .................................. 110137830

(51) Int. Cl.
| | | |
|---|---|---|
| G03F 7/20 | (2006.01) | |
| G03F 1/44 | (2012.01) | |
| G03F 7/00 | (2006.01) | |
| G03F 7/11 | (2006.01) | |
| G03F 9/00 | (2006.01) | |

(Continued)

(52) U.S. Cl.
CPC .................. G03F 1/44 (2013.01); G03F 7/11 (2013.01); G03F 7/70616 (2013.01); G03F 7/706835 (2023.05); G03F 9/7015 (2013.01); G03F 9/7076 (2013.01); G06T 7/001 (2013.01); H01L 22/12 (2013.01)

(58) Field of Classification Search
CPC .......... G03F 1/44; G03F 7/11; G03F 7/70616; G03F 7/706835; G03F 9/7015; G03F 9/7076; G03F 1/00; G03F 7/70633; G03F 1/84; G06T 7/001; H01L 22/12
See application file for complete search history.

(56) References Cited

U.S. PATENT DOCUMENTS

2015/0212019 A1*  7/2015  Shishido ............ G01N 23/2251
                                                    250/307
2016/0334674 A1* 11/2016  Yu .............................. G03F 7/22
(Continued)

FOREIGN PATENT DOCUMENTS

| CN | 1601379 A | 3/2005 |
|---|---|---|
| CN | 103165417 A | 6/2013 |

(Continued)

*Primary Examiner* — Mesfin T Asfaw
(74) *Attorney, Agent, or Firm* — CKC & Partners Co., LLC

(57) ABSTRACT

An operating method includes: placing a first mask, a second mask, a third mask and a fourth mask on a rotating base, in which each of the first, second, third and fourth masks has a first exposure unit, a second exposure unit, a third exposure unit and a fourth exposure unit; overlaying the first, second, third and fourth masks such that the first exposure unit of the first mask, the second exposure unit of the second mask, the third exposure unit of the third mask and the fourth exposure unit of the fourth mask are arranged adjacently to form an exposure area; simulating a first coordinate information according to the exposure area by an image simulation unit; scanning the exposure area, by a scanning electron microscope (SEM), to obtain a second coordinate information; and comparing the first coordinate information with the second coordinate information.

10 Claims, 8 Drawing Sheets

(51) Int. Cl.
    *G06T 7/00*           (2017.01)
    *H01L 21/66*       (2006.01)

(56) References Cited

U.S. PATENT DOCUMENTS

2017/0243343 A1    8/2017   Weinberg et al.
2020/0166853 A1    5/2020   Eugeni

FOREIGN PATENT DOCUMENTS

| | | |
|---|---|---|
| CN | 111316173 A | 6/2020 |
| DE | 102017221163 A1 | 10/2018 |
| JP | 2003068612 A | 3/2003 |
| TW | 200516350 A | 5/2005 |
| TW | I461861 B | 11/2014 |

\* cited by examiner placing a first mask, a second mask, a third mask and a fourth mask on a rotating base, wherein each of the first mask, the second mask, the third mask and the fourth mask has a first exposure unit, a second exposure unit, a third exposure unit and a fourth exposure unit — S1 overlaying the first mask, the second mask, the third mask and the fourth mask such that the first exposure unit of the first mask, the second exposure unit of the second mask, the third exposure unit of the third mask and the fourth exposure unit of the fourth mask are arranged adjacently to form an exposure area — S2 simulating a first coordinate information in accordance with the exposure area by an image simulation unit — S3 scanning the exposure area, by a scanning electron microscope (sem), to obtain a second coordinate information — S4 comparing the first coordinate information with the second coordinate information — S5

Fig. 4

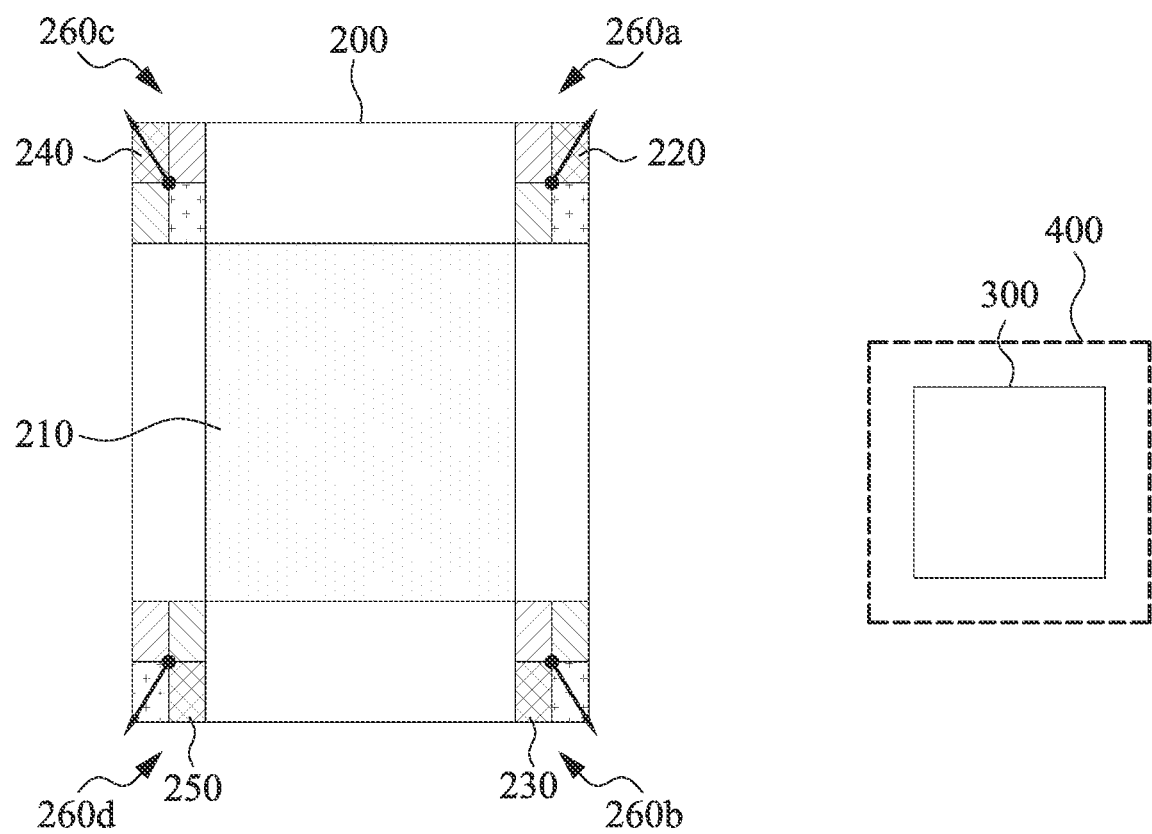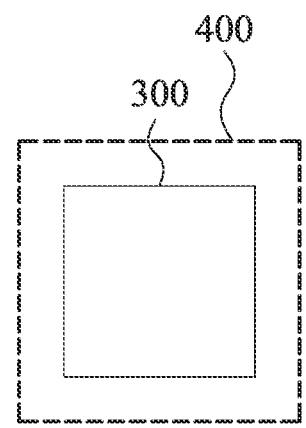
Fig. 9A
Fig. 9B

LITHOGRAPHY MEASUREMENT MACHINE AND OPERATING METHOD THEREOF

RELATED APPLICATION

This application claims priority to Taiwanese Application Serial Number 110137830, filed Oct. 12, 2021, which is herein incorporated by reference in its entirety.

BACKGROUND

Field of Invention

The present disclosure relates to a lithography measurement machine and an operating method of the lithography measurement machine.

Description of Related Art

In general, when a lithography machine etches the first layer of a mask, because there is no front-layer mask to calibrate a shift, a lithography effect of the first layer of the mask may be determined by conditions of the lithography machine, therefore making it easier for the first layer of the mask to generate defects. In addition, since the lithography machine does not typically have an alignment mark to provide an alignment effect when the first layer of the mask is etched, the lithography machine cannot perform an automatic compensation operation. As a result, the lithography machine needs to perform a compensation operation by subsequently measuring an overlaying mark.

SUMMARY

An aspect of the present disclosure is related to a lithography measurement machine.

According to one embodiment of the present disclosure, a lithography measurement machine includes a rotating base, an image simulation unit, a scanning electron microscope (SEM) and a processor. The rotating base is configured to place a first mask, a second mask, a third mask and a fourth mask. Each of the first mask, the second mask, the third mask and the fourth mask has a first exposure unit, a second exposure unit, a third exposure unit and a fourth exposure unit. The first mask, the second mask, the third mask and the fourth mask are staggered such that the first exposure unit of the first mask, the second exposure unit of the second mask, the third exposure unit of the third mask and the fourth exposure unit of the fourth mask are arranged adjacently to form an exposure area. The image simulation unit is configured to simulate the first coordinate information according to the exposure area. The first coordinate information has a first center. The scanning electron microscope (SEM) is configured to scan the exposure area to obtain the second coordinate information. The second coordinate information has a second center. The processor is electrically connected with the image simulation unit and the scanning electron microscope. The processor is configured to compare the first coordination information with the second coordinate information.

In one embodiment of the present disclosure, the first exposure unit of the first mask, the fourth exposure unit of the fourth mask, the second exposure unit of the second mask and the third exposure unit of the third mask are sequentially arranged in a clockwise direction.

In one embodiment of the present disclosure, when a distance is located between the first center of the first coordinate information and the second center of the second coordinate information, the processor is configured to perform a compensation operation to the rotating base according to the distance.

In one embodiment of the present disclosure, the first coordinate information simulated by the image simulation unit according to the exposure area includes a Graphic Data System (GDS) file format.

In one embodiment of the present disclosure, the processor is configured to compare the exposure area with the first coordinate information such that the exposure area overlaps the first coordinate information.

In one embodiment of the present disclosure, the first exposure unit of the first mask is located between the third exposure unit of the third mask and the first exposure unit of the third mask, and the fourth exposure unit of the fourth mask is located between the second exposure unit of the second mask and the second exposure unit of the fourth mask.

Another aspect of the present disclosure is related to an operating method of a lithography measurement machine.

According to one embodiment of the present disclosure, an operating method of a lithography measurement machine includes: placing a first mask, a second mask, a third mask and a fourth mask on a rotating base, wherein each of the first mask, the second mask, the third mask and the fourth mask has a first exposure unit, a second exposure unit, a third exposure unit and a fourth exposure unit; overlaying the first mask, the second mask, the third mask and the fourth mask such that the first exposure unit of the first mask, the second exposure unit of the second mask, the third exposure unit of the third mask and the fourth exposure unit of the fourth mask are arranged adjacently to form an exposure area; simulating a first coordinate information in accordance with the exposure area by an image simulation unit; scanning the exposure area, by a scanning electron microscope (SEM), to obtain a second coordinate information; and comparing the first coordinate information with the second coordinate information.

In one embodiment of the present disclosure, the method further includes performing a compensation operation to the rotating base according to a distance when the distance is located between the first center of the first coordinate information and the second center of the second coordinate information.

In one embodiment of the present disclosure, the method further includes comparing the exposure area with the first coordinate information such that the exposure area overlaps the first coordinate information.

In one embodiment of the present disclosure, overlaying the first mask, the second mask, the third mask and the fourth mask is performed such that the first exposure unit of the first mask is located between the third exposure unit of the third mask and the first exposure unit of the third mask, and the fourth exposure unit of the fourth mask is located between the second exposure unit of the second mask and the second exposure unit of the fourth mask.

In the aforementioned embodiments of the present disclosure, because the image simulation unit of the lithography measurement machine may simulate the first coordinate information according to the exposure area and the scanning electron microscope of the lithography measurement machine may scan the exposure area to obtain the second coordinate information, the lithography measurement machine may compare the first coordinate information with the second coordinate information to determine whether the first mask, the second mask, the third mask and the fourth mask are located at the required positions. When a distance is defined between the first center of the first coordinate information and the second center of the second coordinate information, the processor of the lithography measurement machine may perform the compensation operation to the rotating base according to the distance to move the first mask, the second mask, and the third mask and the fourth mask to the required positions. Since the masks (such as the first mask, the second mask, the third mask and the fourth mask) of a first layer are compensated and moved to the required positions, an overlaying effect between different layers may be improved to increase product yield when masks of the different layers and the masks of the first layer are thus compensated for.

BRIEF DESCRIPTION OF THE DRAWINGS

FIG. 4 illustrates a flow chart of an operating method of a lithography measurement machine according to one embodiment of the present disclosure.

FIG. 9A illustrates a schematic view of exposure areas according to yet another embodiment of the present disclosure, and FIG. 9B illustrates a schematic view when the exposure areas of FIG. 9A have been shifted.

DETAILED DESCRIPTION

Figure 1:
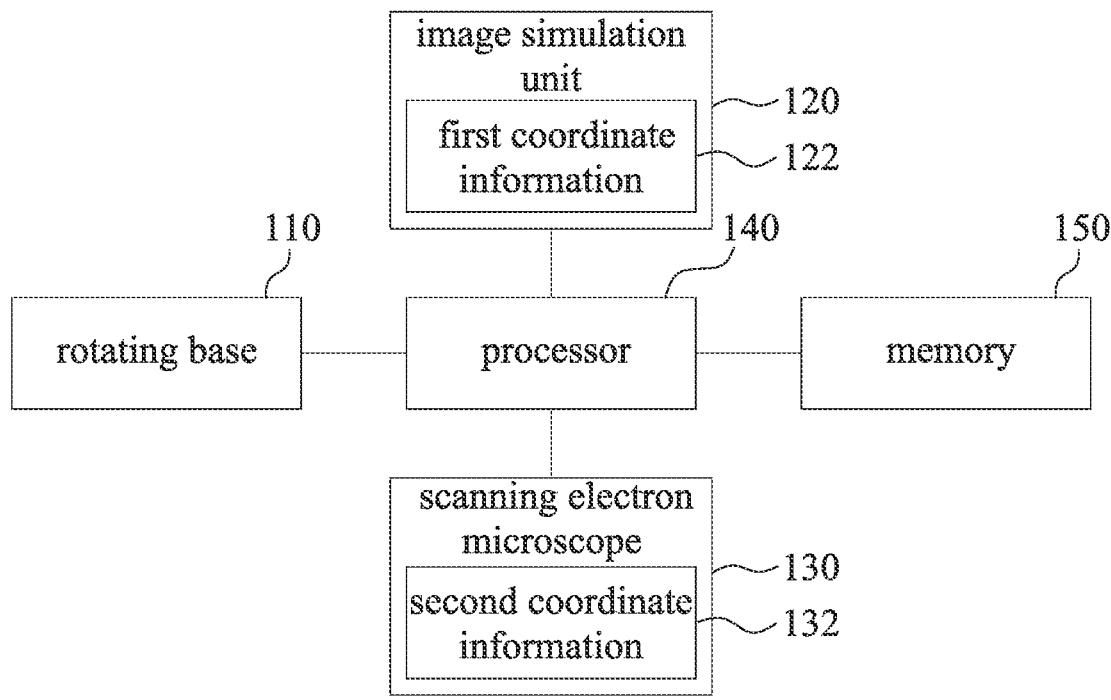
FIG. 1 illustrates a block view of a lithography measurement machine according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
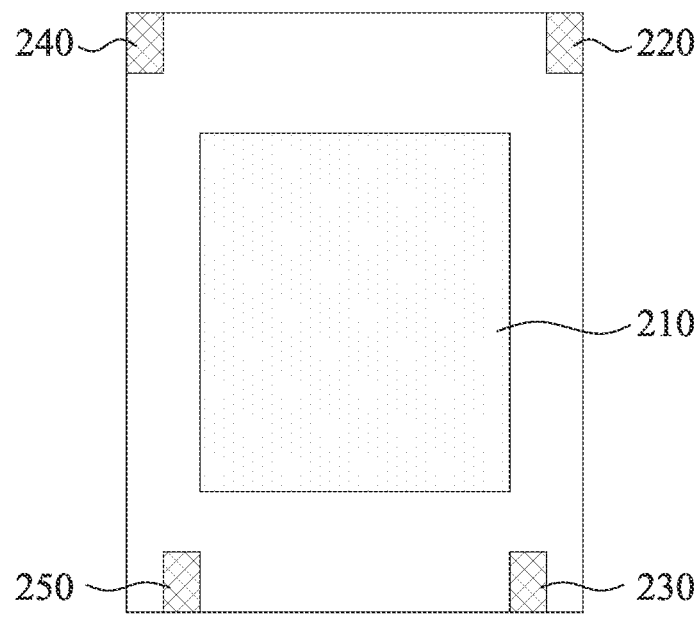
FIG. 2 illustrates a top view of a first mask located on a rotating base of the lithography measurement machine of FIG. 1.

FIG. 1 illustrates a block view of a lithography measurement machine 100 according to one embodiment of the present disclosure. FIG. 2 illustrates a top view of a first mask 200 located on a rotating base 110 of the lithography measurement machine 100 of FIG. 1. Referring to both FIG. 1 and FIG. 2, the lithography measurement machine 100 includes the rotating base 110, an image simulation unit 120, a scanning electron microscope (SEM) 130 and a processor 140. The first mask 200 may be located on the rotating base 110, and the first mask 200 has a lithography unit 210, a first exposure unit 220, a second exposure unit 230, a third exposure unit 240, and a fourth exposure unit 250. In one embodiment, the first exposure unit 220, the second exposure unit 230, the third exposure unit 240, and the fourth exposure unit 250 may be located at edges of the first mask 200, and the lithography unit 210 may be located in the middle of the first mask 200. For example, the first exposure unit 220, the second exposure unit 230, the third exposure unit 240, and the fourth exposure unit 250 of the first mask 200 may represent four cutting lanes of the first mask 200, and the lithography measurement machine 100 may cut along the four cutting lanes to obtain the lithography unit 210.

Figure 3:
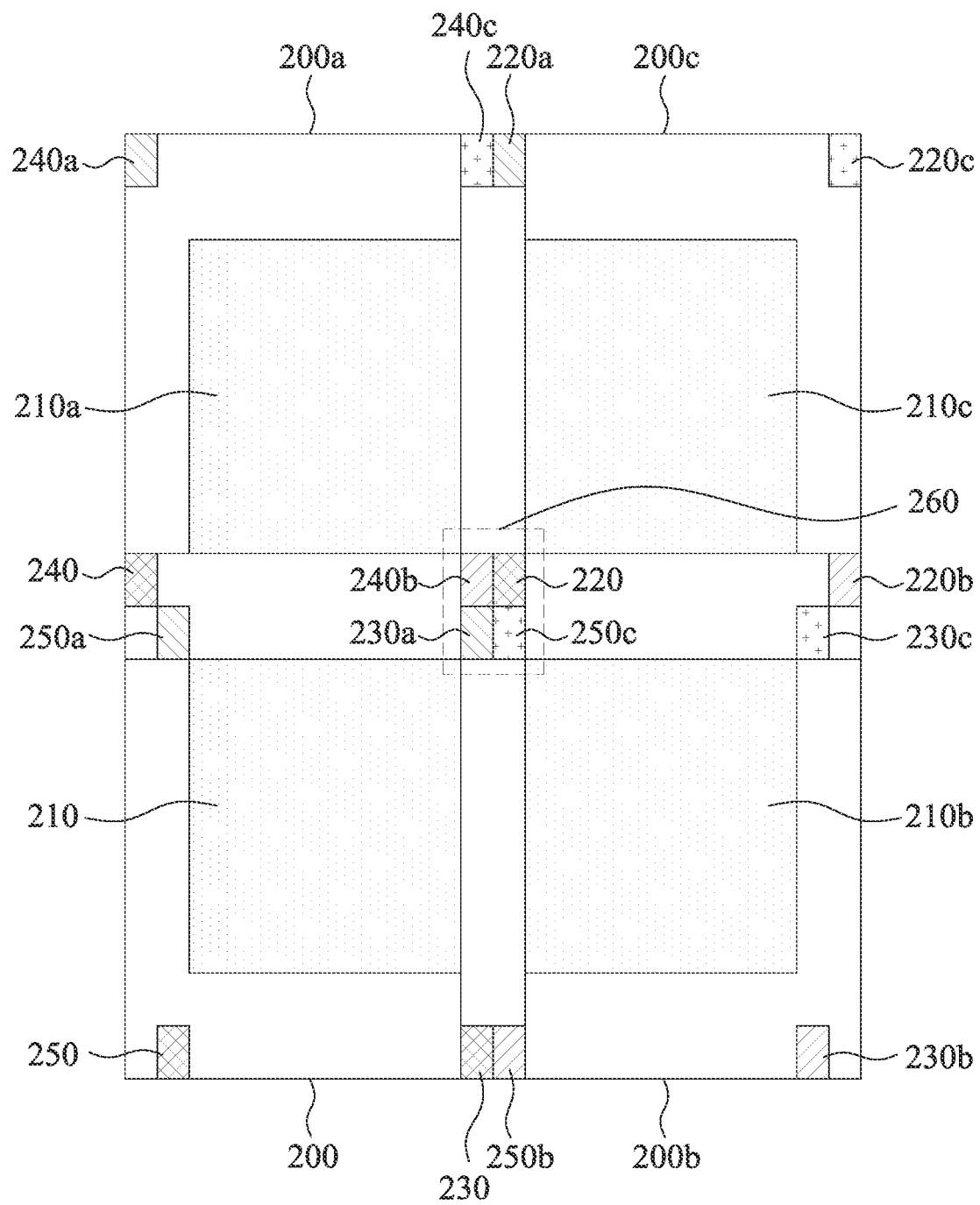
FIG. 3 illustrates a top view when the first mask of FIG. 2 overlays with a second mask, a third mask and a fourth mask.

FIG. 3 illustrates a top view when the first mask 200 of FIG. 2 overlays with a second mask 200a, a third mask 200b and a fourth mask 200c. Referring to both FIG. 1 and FIG. 3, the first mask 200, the second mask 200a, the third mask 200b, and the fourth mask 200c may be located on the rotating base 110. The second mask 200a has a lithography unit 210a, a first exposure unit 220a, a second exposure unit 230a, a third exposure unit 240a and a fourth exposure unit 250a. Also, the third mask 200b has a lithography unit 210b, a first exposure unit 220b, a second exposure unit 230b, a third exposure unit 240b, and a fourth exposure unit 250b, and the fourth mask 200c has a lithography unit 210c, a first exposure unit 220c, a second exposure unit 230c, a third exposure unit 240c and a fourth exposure unit 250c. In one embodiment, the first mask 200, the second mask 200a, the third mask 200b and the fourth mask 200c are staggered such that the first exposure unit 220 of the first mask 200, the second exposure unit 230a of the second mask 200a, the third exposure unit 240b of the third mask 200b and the fourth exposure unit 250c of the fourth mask 200c are arranged adjacently to form an exposure area 260. In other words, the exposure area 260 has coordinate information of the first mask 200, the second mask 200a, the third mask 200b and the fourth mask 200c.

The image simulation unit 120 of the lithography measurement machine 100 is configured to simulate first coordinate information 122 according to the exposure area 260. In one embodiment, the first coordinate information 122 simulated by the image simulation unit 120 according to the exposure area 260 includes a Graphic Data System (GDS)

file format. The scanning electron microscope 130 of the lithography measurement machine 100 is configured to scan the exposure area 260 to obtain second coordinate information 132. The lithography measurement machine 100 further includes a memory 150. The memory 150 is electrically connected with the processor 140, and the memory 150 is configured to store the first coordinate information 122 and the second coordinate information 132. The processor 140 of the lithography measurement machine 100 is electrically connected with the image simulation unit 120 and the scanning electron microscope 130, and the processor 140 is configured to compare the first coordinate information 122 with the second coordinate information 132 to figure out whether the first mask 200, the second mask 200a, the third mask 200b and the fourth mask 200c are located at required positions.

In one embodiment, the first exposure unit 220 of the first mask 200, the fourth exposure unit 250c of the fourth mask 200c, the second exposure unit 230a of the second mask 200a and the third exposure units 240b of the third mask 200b are sequentially arranged in a clockwise direction. In addition, the first exposure unit 220 of the first mask 200 is located between the third exposure unit 240b of the third mask 200b and the first exposure unit 220b of the third mask 200b, and the fourth exposure unit 250c of the fourth mask 200c is located between the second exposure unit 230a of the second mask 200a and the second exposure unit 230c of the fourth mask 200c.

Specifically, because the image simulation unit 120 of the lithography measurement machine 100 may simulate the first coordinate information 122 according to the exposure area 260 and the scanning electron microscope 130 of the lithography measurement machine 100 may scan the exposure area 260 to obtain the second coordinate information 132, the lithography measurement machine 100 may compare the first coordinate information 122 with the second coordinate information 132 to figure out whether the first mask 200, the second mask 200a, the third mask 200b and the fourth mask 200c are located at the required positions.

In the following description, an operating method of a lithography measurement machine will be described. It is to be noted that the connection relationship of the aforementioned elements will not be repeated.

FIG. 4 illustrates a flow chart of an operating method of a lithography measurement machine according to one embodiment of the present disclosure. The operating method of the lithography measurement machine includes steps as outlined below. In step S1, a first mask, a second mask, a third mask and a fourth mask are placed on a rotating base, wherein each of the first mask, the second mask, the third mask and the fourth mask has a first exposure unit, a second exposure unit, a third exposure unit and a fourth exposure unit. In step S2, the first mask, the second mask, the third mask and the fourth mask are overlaid such that the first exposure unit of the first mask, the second exposure unit of the second mask, the third exposure unit of the third mask and the fourth exposure unit of the fourth mask are arranged adjacently to form an exposure area. In step S3, a first coordinate information is simulated in accordance with the exposure area by an image simulation unit. In step S4, the exposure area is scanned by a scanning electron microscope (SEM) to obtain a second coordinate information. In step S5, the first coordinate information is compared with the second coordinate information. In the following description, the aforementioned steps will be described in detail.

Figure 5A:
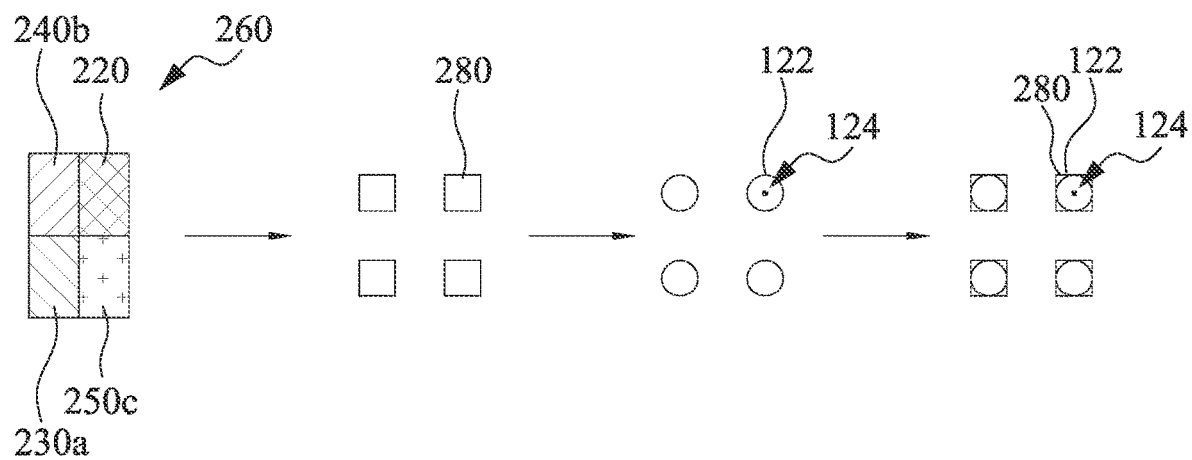
FIG. 5A illustrates a schematic view of the first coordinate information of FIG. 1.

Referring to both FIG. 1 and FIG. 3, the first mask 200, the second mask 200a, the third mask 200b and the fourth mask 200c are placed on the rotating base 110 of the lithography measurement machine 100. Next, the first mask 200, the second mask 200a, the third mask 200b, and the fourth mask 200c are overlaid such that the first exposure unit 220 of the first mask 200, the second exposure unit 230a of the second mask 200a, the third exposure unit 240b of the third mask 200b and the fourth exposure unit 250c of the fourth mask 200c are arranged adjacently to form the exposure area 260. In addition, overlaying the first mask 200, the second mask 200a, the third mask 200b and the fourth mask 200c is performed such that the first exposure unit 220 of the first mask 200 is located between the third exposure unit 240b of the third mask 200b and the first exposure unit 220b of the third mask 200b, and the fourth exposure unit 250c of the fourth mask 200c is located between the second exposure unit 230a of the second mask 200a and the second exposure unit 230c of the fourth mask FIG. 5A illustrates a schematic view of the first coordinate information 122 of FIG. 1. Referring to both FIG. 1 and FIG. 5A, next, the image simulation unit 120 of the lithography measurement machine 100 may simulate the first coordinate information 122 according to the exposure area 260. The first coordinate information 122 has a first center 124. In detail, the image simulation unit 120 of the lithography measurement machine 100 converts a physical position of the exposure area 260 into a virtual coordinate 280, and the image simulation unit 120 simulates the first center 124 of the first coordinate information 122 according to the virtual coordinate 280 of the exposure area 260. In addition, the method further includes comparing the virtual coordinate 280 of the exposure area 260 with the first coordinate information 122 by the processor 140 of the lithography measurement machine 100, so that the virtual coordinate 280 of the exposure area 260 overlaps the first coordinate information 122 to ensure a conversion process has no error.

Figure 5B:
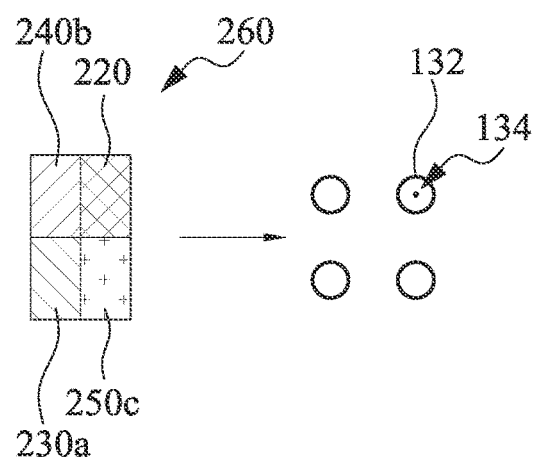
FIG. 5B illustrates a schematic view of the second coordinate information of FIG. 1.

FIG. 5B illustrates a schematic view of the second coordinate information 132 of FIG. 1. Referring to both FIG. 1 and FIG. 5B, next, the scanning electron microscope 130 of the lithography measurement machine 100 may scan the exposure area 260 to obtain the second coordinate information 132. The second coordinate information 132 has a second center 134. In addition, the method further includes storing the first coordinate information 122 and the second coordinate information 132 by the memory 150 of the lithography measurement machine 100. The memory 150 is electrically connected with the processor 140.

Figure 6A:
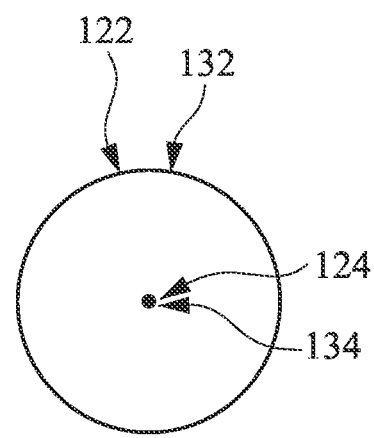
FIG. 6A illustrates a schematic view when the first coordinate information of FIG. 5A overlaps the second coordinate information of FIG. 5B.

FIG. 6A illustrates a schematic view when the first coordinate information 122 of FIG. 5A overlaps the second coordinate information 132 of FIG. 5B. Referring to FIG. 1, FIG. 3 and FIG. 6A, next, the processor 140 of the lithography measurement machine 100 may compare the first coordinate information 122 with the second coordinate information 132 to figure out whether the first coordinate information 122 overlaps the second coordinate information 132. If the first coordinate information 122 overlaps the second coordinate information 132, it means that the first mask 200, the second mask 200a, the third mask 200b and the fourth mask 200c are located at the required positions, and a next process may be performed.

Figure 6B:
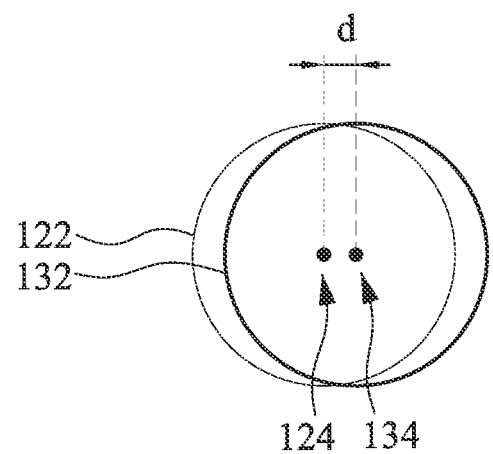
FIG. 6B illustrates a schematic view when a distance is defined between a first center of the first coordinate information of the FIG. 5A and a second center of the second coordinate information of the FIG. 5B.

FIG. 6B illustrates a schematic view when a distance d is defined between the first center 124 of the first coordinate information 122 of the FIG. 5A and the second center 134 of the second coordinate information 132 of the FIG. 5B. Referring to FIG. 1, FIG. 3 and FIG. 6B, next, the method further includes when the distance d is defined between the first center 124 of the first coordinate information 122 and the second center 134 of the second coordinate information 132 (that is, the first mask 200, the second mask 200a the third mask 200b and the fourth mask 200c are shifted), the processor 140 of the lithography measurement machine 100 may perform a compensation operation to the rotating base 110 according to the distance d, so that the first coordinate information 122 overlaps the second coordinate information 132 (the first mask 200, the second mask 200a, the third mask 200b and the fourth mask 200c are moved to the required positions). Since the masks (such as the first mask 200, the second mask 200a, the third mask 200b and the fourth mask 200c) of a first layer are compensated and moved to the required positions, an overlaying effect between different layers may be improved to increase product yield when masks of the different layers and the masks of the first layer are thus compensated for.

Figure 7A:
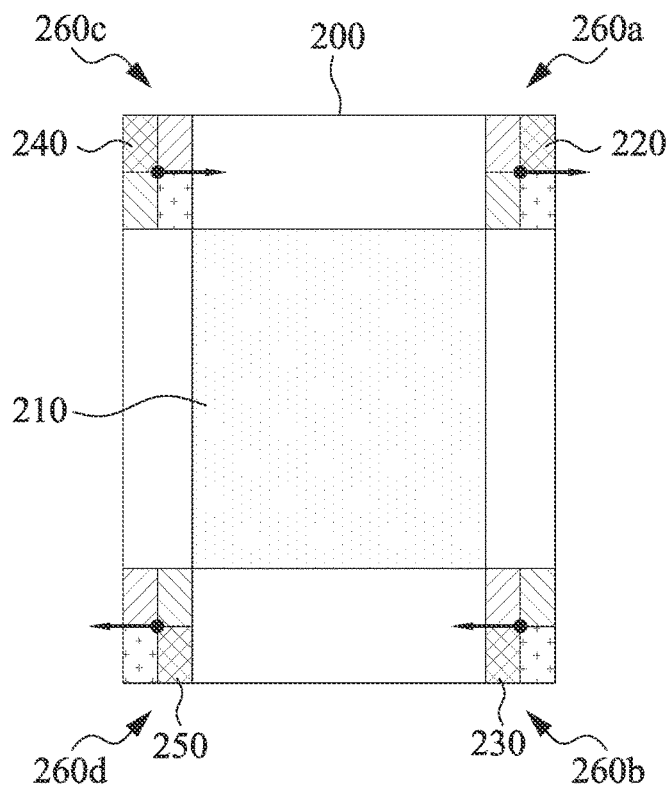
FIG. 7A illustrates a schematic view of exposure areas according to one embodiment of the present disclosure.
Figure 7B:
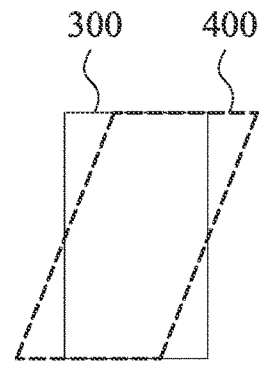
FIG. 7B illustrates a schematic view when the exposure areas of FIG. 7A have been shifted.
Figure 8A:
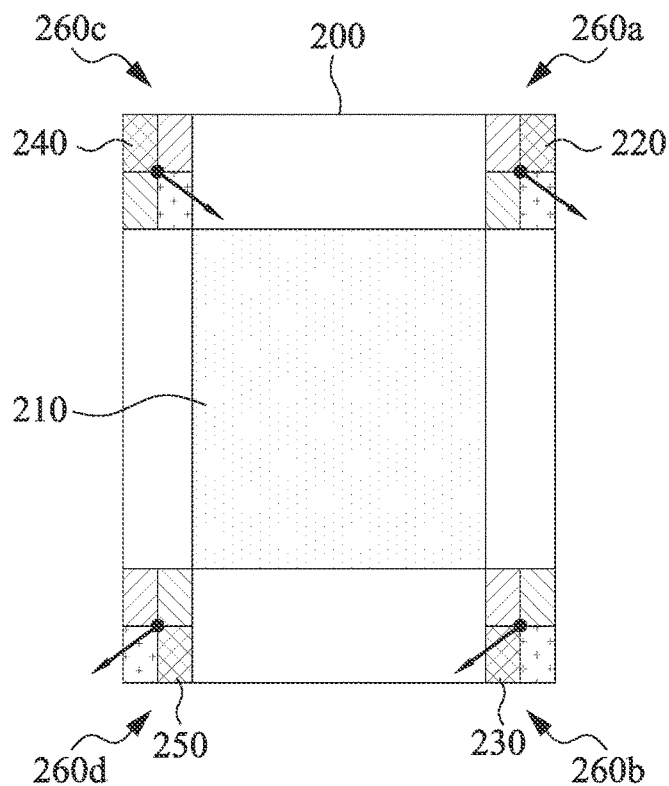
FIG. 8A illustrates a schematic view of exposure areas according to another embodiment of the present disclosure.
Figure 8B:
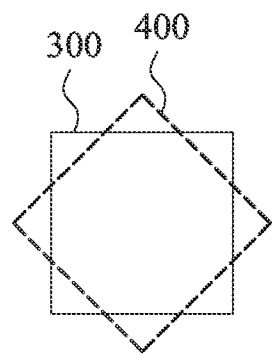
FIG. 8B illustrates a schematic view when the exposure areas of FIG. 8A have been shifted.

FIG. 7A illustrates a schematic view of exposure areas 260a, 260b, 260c and 260d according to one embodiment of the present disclosure, and FIG. 7B illustrates a schematic view when the exposure areas 260a, 260b, 260c and 260d of FIG. 7A have been shifted. Referring to both FIG. 7A and FIG. 7B, in one embodiment, four exposure areas 260a, 260b, 260c and 260d are located on the first mask 200, and a formation method of each of the exposure area 260a, 260b, 260c and 260d is similar to the method described in FIG. 3. In detail, twelve masks are located around the first mask 200, and the twelve masks overlap the first mask 200 such that the twelve masks, the first exposure unit 220, the second exposure unit 230, the third exposure unit 240, and the fourth exposure unit 250 are arranged adjacently to form the exposure areas 260a, 260b, 260c and 260d. An image 300 is a standard image required by the lithography measurement machine 100 (see FIG. 1). When the exposure areas 260a, 260b, 260c and 260d are shifted in arrow directions (that is, the upper two exposure areas 260a and 206c are shifted to the right and the lower two exposure areas 260b and 260d are shifted to the left), the lithography measurement machine 100 converts the exposure areas 260a, 260b, 260c and 260d into an image 400. If the lithography measurement machine 100 measures that the image 400 does not overlap the image 300, the lithography measurement machine 100 will perform the compensation operation according to the shift of the image 400 such that the image 300 may overlap the image FIG. 8A illustrates a schematic view of the exposure areas 260a, 260b, 260c and 260d according to another embodiment of the present disclosure, and FIG. 8B illustrates a schematic view when the exposure areas 260a, 260b, 260c and 260d of FIG. 8A have been shifted. Referring to both FIG. 8A and FIG. 8B, the difference between this embodiment and the embodiment shown in FIG. 7A is that the upper two exposure areas 260a and 260c are shifted to the lower right and the lower two exposure areas 260b and 260d are shifted to the lower left, causing the image 400 to rotate. When the lithography measurement machine 100 (see FIG. 1) measures that the image 300 does not overlap the image 400 measured, the lithography measurement machine 100 will perform the compensation operation according to rotation of the image 400, so that the image 300 may overlap the image 400.

FIG. 9A illustrates a schematic view of the exposure areas 260a, 260b, 260c and 260d according to yet another embodiment of the present disclosure, and FIG. 9B illustrates a schematic view when the exposure areas 260a, 260b, 260c and 260d of FIG. 9A have been shifted. Referring to both FIG. 9A and FIG. 9B, the difference between this embodiment and the embodiment shown in FIG. 7A is that the upper left exposure area 260c shifts to the upper left, the upper right exposure area 260a shifts to the upper right, the lower left exposure area 260d shifts to the lower left, and the lower right exposure area 260b shifts to the lower right, causing the image 400 to be enlarged. When the lithography measurement machine 100 (see FIG. 1) measures that the image 300 does not overlap the image 400, the lithography measurement machine 100 will perform the compensation operation according to enlargement of the image 400 such that the image 300 may overlap the image 400.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography measurement machine, comprising:
   a rotating base configured to place a first mask, a second mask, a third mask and a fourth mask, wherein each of the first mask, the second mask, the third mask and the fourth mask has a first exposure unit, a second exposure unit, a third exposure unit and a fourth exposure unit, and the first mask, the second mask, the third mask and the fourth mask are staggered such that the first exposure unit of the first mask, the second exposure unit of the second mask, the third exposure unit of the third mask and the fourth exposure unit of the fourth mask are arranged adjacently to form an exposure area, the first exposure unit is adjacent to the second exposure unit, the first exposure unit and the second exposure unit are disposed along a first direction, the fourth exposure unit is adjacent to the first exposure unit, the fourth exposure unit and the first exposure unit are disposed along a second direction, and the first direction is perpendicular to the second direction;
   an image simulation unit configured to simulate a first coordinate information according to the exposure area, wherein the first coordinate information has a first center;
   a scanning electron microscope (SEM) configured to scan the exposure area to obtain a second coordinate information, wherein the second coordinate information has a second center; and
   a processor electrically connected with the image simulation unit and the scanning electron microscope, wherein the processor is configured to compare the first coordination information with the second coordinate information.

2. The lithography measurement machine of claim 1, wherein the first exposure unit of the first mask, the fourth exposure unit of the fourth mask, the second exposure unit of the second mask and the third exposure unit of the third mask are sequentially arranged in a clockwise direction.

3. The lithography measurement machine of claim 1, wherein when a distance is defined between the first center of the first coordinate information and the second center of the second coordinate information, the processor is configured to perform a compensation operation to the rotating base according to the distance.

4. The lithography measurement machine of claim 1, wherein the first coordinate information simulated by the image simulation unit according to the exposure area comprises a Graphic Data System (GDS) file format.

5. The lithography measurement machine of claim 1, wherein the processor is configured to compare the exposure area with the first coordinate information such that the exposure area overlaps the first coordinate information.

6. The lithography measurement machine of claim 1, wherein the first exposure unit of the first mask is located between the third exposure unit of the third mask and the first exposure unit of the third mask, and the fourth exposure unit of the fourth mask is located between the second exposure unit of the second mask and the second exposure unit of the fourth mask.

7. An operating method of a lithography measurement machine, comprising:

placing a first mask, a second mask, a third mask and a fourth mask on a rotating base, wherein each of the first mask, the second mask, the third mask and the fourth mask has a first exposure unit, a second exposure unit, a third exposure unit and a fourth exposure unit;

overlaying the first mask, the second mask, the third mask and the fourth mask such that the first exposure unit of the first mask, the second exposure unit of the second mask, the third exposure unit of the third mask and the fourth exposure unit of the fourth mask are arranged adjacently to form an exposure area, the first exposure unit is adjacent to the second exposure unit, the first exposure unit and the second exposure unit are disposed along a first direction, the fourth exposure unit is adjacent to the first exposure unit, the fourth exposure unit and the first exposure unit are disposed along a second direction, and the first direction is perpendicular to the second direction;

simulating a first coordinate information in accordance with the exposure area by an image simulation unit;

scanning the exposure area, by a scanning electron microscope (SEM), to obtain a second coordinate information; and comparing the first coordinate information with the second coordinate information.

8. The operating method of the lithography measurement machine of claim 7, further comprising:

performing a compensation operation to the rotating base according to a distance when the distance is defined between a first center of the first coordinate information and a second center of the second coordinate information.

9. The operating method of the lithography measurement machine of claim 7, further comprising:

comparing the exposure area with the first coordinate information such that the exposure area overlaps the first coordinate information.

10. The operating method of the lithography measurement machine of claim 7, wherein overlaying the first mask, the second mask, the third mask and the fourth mask is performed such that the first exposure unit of the first mask is located between the third exposure unit of the third mask and the first exposure unit of the third mask, and the fourth exposure unit of the fourth mask is located between the second exposure unit of the second mask and the second exposure unit of the fourth mask.

* * * * *